United States Patent [19]

Czech et al.

[11] Patent Number: 5,582,635
[45] Date of Patent: Dec. 10, 1996

[54] HIGH TEMPERATURE-RESISTANT CORROSION PROTECTION COATING FOR A COMPONENT IN PARTICULAR A GAS TURBINE COMPONENT

[75] Inventors: Norbert Czech, Dorsten; Friedhelm Schmitz, Dinslaken, both of Germany

[73] Assignee: Siemens Aktiengesellschaft, Munich, Germany

[21] Appl. No.: 411,459

[22] Filed: Mar. 28, 1995

Related U.S. Application Data

[63] Continuation-in-part of Ser. No. 82,602, Jun. 25, 1993, Pat. No. 5,401,307, which is a continuation-in-part of Ser. No. 566,144, Aug. 10, 1990, abandoned.

[51] Int. Cl.$^6$ .............................. C09D 5/08; B32B 15/04; C22C 19/07
[52] U.S. Cl. .............. 106/14.05; 420/437; 420/438; 420/445; 420/446; 420/447; 420/448; 420/449; 420/450; 427/248.1; 427/383.1; 427/383.3; 427/383.7; 427/455; 427/456; 427/576; 428/457
[58] Field of Search ................ 106/1.21, 14.05, 106/1.27, 1.28; 420/445, 446, 442, 447, 448, 449, 450, 437, 438; 427/383.1, 383.3, 383.7, 576, 455, 456, 248.1; 428/457

[56] References Cited

U.S. PATENT DOCUMENTS

| | | | |
|---|---|---|---|
| 3,928,026 | 12/1975 | Hecht et al. | 428/615 |
| 4,005,989 | 2/1977 | Preston | 427/405 |
| 4,034,142 | 7/1977 | Hecht | 428/678 |
| 4,093,476 | 6/1978 | Boesch | 148/410 |
| 4,346,137 | 8/1982 | Hecht | 428/215 |
| 4,451,299 | 5/1984 | Smeggil et al. | 427/380 |
| 4,764,225 | 8/1988 | Shanhat et al. | 148/410 |

FOREIGN PATENT DOCUMENTS

| | | |
|---|---|---|
| 0025263 | 3/1981 | European Pat. Off. . |
| 0194392 | 9/1986 | European Pat. Off. . |
| 2463192 | 2/1981 | France . |
| 2511042 | 2/1983 | France . |
| 729862 | 12/1942 | Germany . |
| 1758010 | 12/1970 | Germany . |
| 2355674 | 5/1974 | Germany . |
| 2526683 | 1/1976 | Germany . |
| 2103656 | 2/1983 | Germany . |
| 2095700 | 10/1982 | United Kingdom . |

*Primary Examiner*—Anthony Green
*Attorney, Agent, or Firm*—Herbert L. Lerner; Laurence A. Greenberg

[57] ABSTRACT

A protective coating resistant to corrosion at medium and high temperatures is applied on a nickel-based or cobalt-based superalloy component. The protective coating essentially consists of the following elements (in percent by weight): 25 to 40% nickel, 28 to 32% chromium, 7 to 9% aluminum, 1 to 2% silicon, 0.3 to 1% of at least one reactive element of the rare earths, at least 5% cobalt; and impurities, as well as selectively from 0 to 15% of at least one of the elements of the group consisting of rhenium, platinum, palladium, zirconium, manganese, tungsten, titanium, molybdenum, niobium, iron, hafnium, and tantalum. The total share of the elements of the group is from 0 to a maximum of 15% and a remainder of at least 5% cobalt. The component and the coating applied thereon have a ductile brittle transition temperature below 500° C.

7 Claims, 2 Drawing Sheets

HIGH TEMPERATURE-RESISTANT CORROSION PROTECTION COATING FOR A COMPONENT IN PARTICULAR A GAS TURBINE COMPONENT

CROSS-REFERENCE TO RELATED APPLICATION

This application is a continuation-in-part of application Ser. No. 08/082,602, filed Jun. 25, 1993, now U.S. Pat. No. 5,401,307; which is a continuation-in-part of application Ser. No. 07/566,144, filed Aug. 10, 1990, now abandoned.

BACKGROUND OF THE INVENTION

Field of the Invention

The invention relates to a protective coating and to a component on which the coating is applied, particularly on a gas turbine component or another component made from a nickel-based or cobalt-based alloy.

Numerous compositions of protective coatings of alloys which primarily contain nickel, chromium, cobalt, aluminum and a reactive element of the rare .earths have been developed and tested. One such coating has become known heretofore from U.S. Pat. No. 4,005,989, for example. Other coatings of this general type are known from U.S. Pat. No. 3,928,026 to Hecht et al. and from an article entitled "The Durability and Performance of Coatings in Gas Turbine and Diesel Engines" by J. Fairbanks and R. Hecht, Materials Science and Engineering, 88 (1987), pages 321–330; these papers discuss the ductility properties of such coatings and their significance in the gas turbine environment. From U.S. Pat. No. 4,034,142, it is also known that an additional constituent, silicon, can further improve the properties of such protective coatings. Although the relatively wide ranges of the various elements in these documents, in fact, do suggest qualitatively a way to create protective coatings resistant to high-temperature corrosion, the compositions disclosed are not sufficiently specific quantitatively for all purposes.

German Patent 23 55 674 discloses further compositions for protective coatings, but they are not suitable for uses or applications of the type which can occur with stationary gas turbines having a high inlet temperature.

The ductility of protective coatings for gas turbine components is further discussed in an article by W. Schmidt and G. Lehnert, in Zeitschrift für Werkstofftechnik (magazine for materials science), 15 (1984), pages 73–82. The term ductile brittle transition temperature (DBTT) is introduced in that paper, and thus defined for the purpose of this text, for a combination of a substrate and a protective coating. In this context, the protective coating is deemed to be brittle if it exhibits stress cracking at stresses below the 0.2% elasticity limit of the substrate. The protective coating is deemed to be ductile if it exhibits stress cracking only above the 0.2% elasticity limit of the substrate. The ductile brittle transition temperature of the combination is defined to be the threshold temperature below which the protective coating is brittle and above which it is ductile. In gas turbine applications it is most desirable to provide protective coatings in which the ductile brittle transition temperature (DBTT) is fairly low when combined with suitable substrate materials for the components to which the coatings are to be applied.

It is accordingly an object of the invention to provide a protective coating and a component having the coating applied thereto in which the coating has high resistance to corrosion both at medium temperatures and at high temperatures, and in which the combination of the component and the protective coating has a low ductile brittle transition temperature. The corrosion properties should be improved in the temperature range from 600° to approximately 1150° C. so that such protective coatings can be used particularly in stationary gas turbine systems which operate at partial load or full load.

With the foregoing and other objects in view, there is provided in accordance with the invention, a protective coating resistant to corrosion at medium and high temperatures, consisting essentially of the following elements (in percent by weight): 25 to 40% nickel, 28 to 32% chromium, 7 to 9% aluminum, 95 to 2% silicon, 0.3 to 1% of at least one reactive element of the rare earths, at least 5% cobalt; and impurities, as well as selectively from 0 to 15% of at least one of the elements of the group consisting of rhenium, platinum, palladium, zirconium, manganese, tungsten, titanium, molybdenum, niobium, iron, hafnium, and tantalum, the coating applied on a nickel-based or cobalt-based superalloy substrate defining a combination comprising the coating and the substrate having a ductile brittle transition temperature below 600° C. Preferably, the chromium content is 27 to 31%.

In this regard, the selective inclusion of a particular element of the last-mentioned group of elements is based upon knowledge that the element does not worsen the properties of protective coatings but, instead, actually improves them, at least under certain circumstances.

In accordance with an added feature of the invention, the ductile brittle transition temperature of the combination component/coating is lower than approximately 450° C. and, advantageously, lower than approximately 400° C.

In accordance with another feature of the invention, the protective coating is applied to a component which is a nickel-based superalloy consisting essentially of the following elements (in percent by weight): 0.08 to 0.1% carbon, 12 to 16% chromium, 8 to 10% cobalt, 1.5 to 2% molybdenum, 2.5 to 4% tungsten, 1.5 to 4.5% tantalum, 0 to 1% titanium, 0 to 0.1% zirconium, 0 to 1% hafnium, and a balance of nickel.

In accordance with a further feature of the invention, the protective coating is applied to a component which is a nickel-based superalloy consisting essentially of the following elements (in percent by weight):

0.08 to 0.1% carbon, 12 to 16% chromium, 8 to 10% cobalt, 1.5 to 2 % molybdenum, 2.5 to 4 % tungsten, 1.5 to 4.5% tantalum, 0 to 1% titanium, 0 to 0 1% zirconium, 0 to 1% hafnium, a minor addition of boron, and a balance of nickel.

The following properties or significance can be ascribed to the various constituents of the protective coating:

Cobalt, as a constituent, effects good corrosion properties at high temperatures.

Nickel improves the ductility of the coating and reduces interdiffusion with respect to the nickel-based base materials. The preferred range for nickel is from 25 to 35% and preferably approximately 30%.

Chromium improves the corrosion properties at medium temperatures up to approximately 900° C. and promotes the formation of an aluminum oxide covering film. The preferred range for chromium is from 25 to 31% and in particular approximately 28%. Aluminum improves the corrosion properties at high temperatures up to approximately 1150° C. The share of aluminum should be about 7 to 9%, the preferred share being from 7.5 to 8.5% and, in particular, approximately 8%.

Silicon reinforces the action of chromium and aluminum and promotes the adhesion of the protective oxide film. A favorable range for the silicon constituent is 0.5% to 2%, preferably approximately 0.7%. By means of the addition of silicon, the share of aluminum and/or of chromium can be reduced from the high content actually desired for good corrosion properties to the more favorable values for ductility, without thereby impairing the corrosion properties.

The action of a reactive element, in particular yttrium, is known per se. The preferred range thereof is from 0.3 to 1% and, for the reactive element being yttrium, in particular, approximately 0.6%.

In the preferential ranges given, tests have shown particularly good corrosion properties for the protective coatings for applications in gas turbines having an inlet temperature above 1200° C.

From prior art literature, various elements have become known which do not impair the properties of a protective coating, but rather, in some aspects actually improve them when admixed in a range less than 15%, and in particular in a share of only a few percent. The invention of the instant application is also intended to encompass alloys with such admixtures.

An element which has scarcely been given any consideration for protective coatings, namely rhenium, can markedly improve the corrosion properties if it is admixed in a proportion of from 1 to 15%, preferably 4 to 10%, and in particular approximately 7%.

Although rhenium is not as expensive as most noble metals, as a constituent of a protective coating it can produce properties just as good as those achieved, for example, by platinum, and can also be effective even when it constitutes only a small share of the protective coating.

The coatings according to the invention are applicable by plasma spraying or vapor deposition (PVD), and they are particularly well suited for components like gas turbine blades formed from a nickel-based or cobalt-based superalloy. Other gas-turbine components, as well, particularly in gas turbines having a high inlet temperature of above 1200° C., for example, may be provided with such protective coatings. The special composition of the coating according to the invention has proved in tests to be a particularly suitable selection for stationary gas turbines having a high inlet temperature. Such tests will be discussed in the following.

EXAMPLES

The components onto which the coatings as previously described are applied are advantageously manufactured from nickel-based or cobalt-based superalloys. The components may be formed as follows:

1. Forging alloys consisting essentially of (in percent by weight): 0.03 to 0.05 % carbon, 18 to 19% chromium, 12 to 15% cobalt, 3 to 6% molybdenum, 1 to 1.5% tungsten, 2 to 2.5% aluminum, 3 to 5% titanium, optional minor additions of tantalum, niobium, boron and/or zirconium, balance nickel. Such alloys are known as Udimet 520 and Udimet 720.

2. Casting alloys consisting essentially of (in percent by weight): 0.1 to 0.15% carbon, 18 to 22% chromium, 18 to 19% cobalt, 0 to 2% tungsten, 0 to 4% molybdenum, 0 to 1.5% tantalum, 0 to 1% niobium, 1 to 3% aluminum, 2 to 4 titanium, 0 to 0.75% hafnium, optional minor additions of boron and/or zirconium, balance nickel. Alloys of this type are known as GTD 222, IN 939, IN 6203 and Udimet 500.

3. Casting alloys consisting essentially of (in percent by weight): 0.07 to 0.1% carbon, 12 to 16% chromium, 8 to 10% cobalt, 1.5 to 2% molybdenum, 2.5 to 4% tungsten, 1.5 to 5% tantalum, 0 to 1% niobium, 3to 4% aluminum, 3.5 to 5% titanium, 0 to 0.1% zirconium, 0 to 1% hafnium, an optional minor addition of boron, balance nickel. Such alloys are known as PWA 1483 SX, IN 738 LC, GTD Ill, IN 792 CC and IN 792 DS; IN 738 LC is deemed to be particularly useful in the context of this invention.

4. Casting alloys consisting essentially of (in percent by weight): about 0.25% carbon, 24 to 30% chromium, 10 to 11% nickel, 7 to 8% tungsten, 0 to 4% tantalum, 0 to 0.3 aluminum, 0 to 0.3% titanium, 0 to 0.6% zirconium, an optional minor addition of boron, balance cobalt.

It is particularly advantageous to apply coatings having a thickness between about 200 μm and 300 μm. It has been observed that in such coatings the DBTT of the combination coating/component is only marginally dependent on the thickness of the coating. This provides a substantial amount of operating safety when applying the coating.

TESTS

Several coatings corresponding to prior art coatings and to the above-described compositions on various components were tested in burner rig tests performed at the Institute of Materials Science at the University of Technology Darmstadt, Germany, and other tests specifically directed to the oxidation behavior of the coatings tested. The tests showed unexpected results.

The fuel used in the tests was heating oil EL with 0.5% S, 10 ppm Na and 8 ppm Cl. The temperature was 850° C. and the tests lasted for 817 hours. The parameter measured at the end of the tests was the corrosion depth (in μm). Test results will now be explained in detail with reference to the drawing.

DETAILED DESCRIPTION OF THE DRAWING

Figure 1:
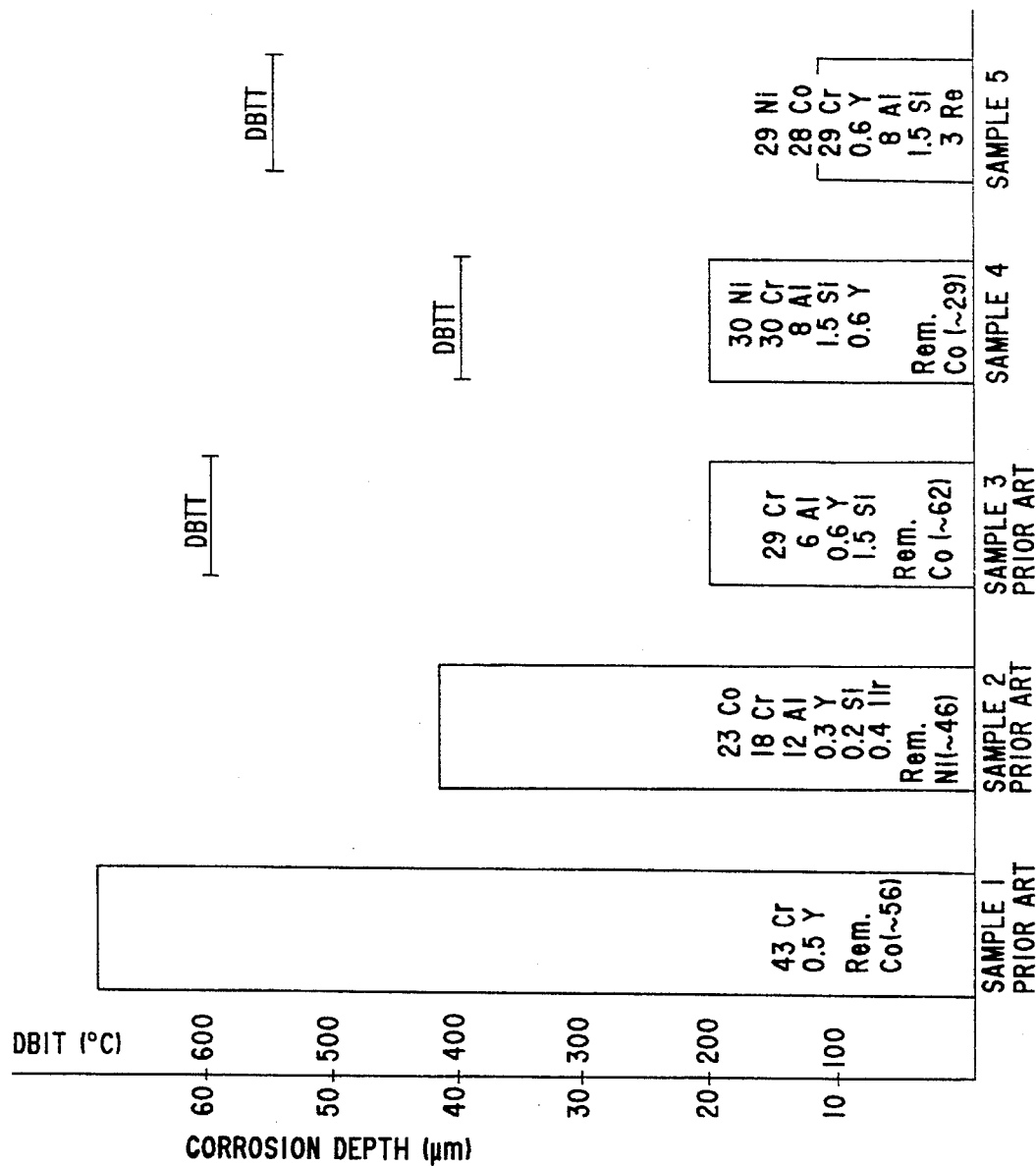
FIG. 1 is a bar graph showing comparative results of tests of various coatings.

With reference to the graph of FIG. 1, which illustrates the first test results, samples 1 and 2 are prior art coatings as they are widely used. Sample 2, for instance, largely corresponds to a coating described in the afore-mentioned Hecht et al. U.S. Pat. No. 4,034,142, wherein a part of the silicon has been replaced with hafnium. Sample 3 is also a prior art coating, a commonly used protective coating generally of the type described in the afore-mentioned patent, additionally improved by adding 1.5% silicon.

With reference to the above-mentioned article by Fairbanks and Hecht e.g. a coating with nickel, cobalt, chromium, aluminum, yttrium, silicon and hafnium apparently led to the best results in a burner rig test. On the basis of the coating shown in the article, the burner rig tests performed on order of this inventor included a coating which distinguished itself from the afore-mentioned patent coatings in the additional hafnium. The additional hafnium, however, is known from the pertinent literature, so that the tested sample 2 would appear to have been one which could have been derived from a combination of the patent with the state of the art.

With regard to the above classification, samples 1, 3, 4 and 5 had a base material IN 738 LC and sample 2 had a base material PWA 1438 SX, which is similar to IN 738 LC.

As compared to sample 2, the inventive samples 4 and 5 are clearly advantageous alone in terms of their corrosion resistance.

As shown in the graph, the prior art samples 1, 2 and 3 exhibited a corrosion depth of 68 μm, 42 μm and 20 μm, respectively. The samples produced according to the invention exhibited corrosion depth of 20 μm and 12 μm, respectively.

Sample 3 has been widely considered the best coating known in the pertinent art, especially in terms of its corrosion resistance properties. The coating corresponds to a coating known as GT-29, developed by General Electric; sample 3 had an additional amount of silicon, the positive effect of which is now widely acknowledged in the art. As compared to the inventive coating, sample 3 (GT-29+Si) has ductility properties which are clearly inferior to the inventive samples 4 and 5. In other words, sample 3 has a DBTT of about 600° C., while samples 4 and 5 have a DBTT of about 400° C. and below 600° C., respectively.

It was shown in the rig test that the coatings according to the invention have an equally good (sample 4) corrosion resistance, or with added 3% rhenium (sample 5) even an unexpectedly improved corrosion resistance.

The most unexpected result was the highly improved ductility which samples 4 and 5 exhibited as compared to sample 3 while not sacrificing or even improving in terms of corrosion resistance. The ductile brittle transition temperatures (DBTT) for samples 3–5 are indicated.

Figure 2:
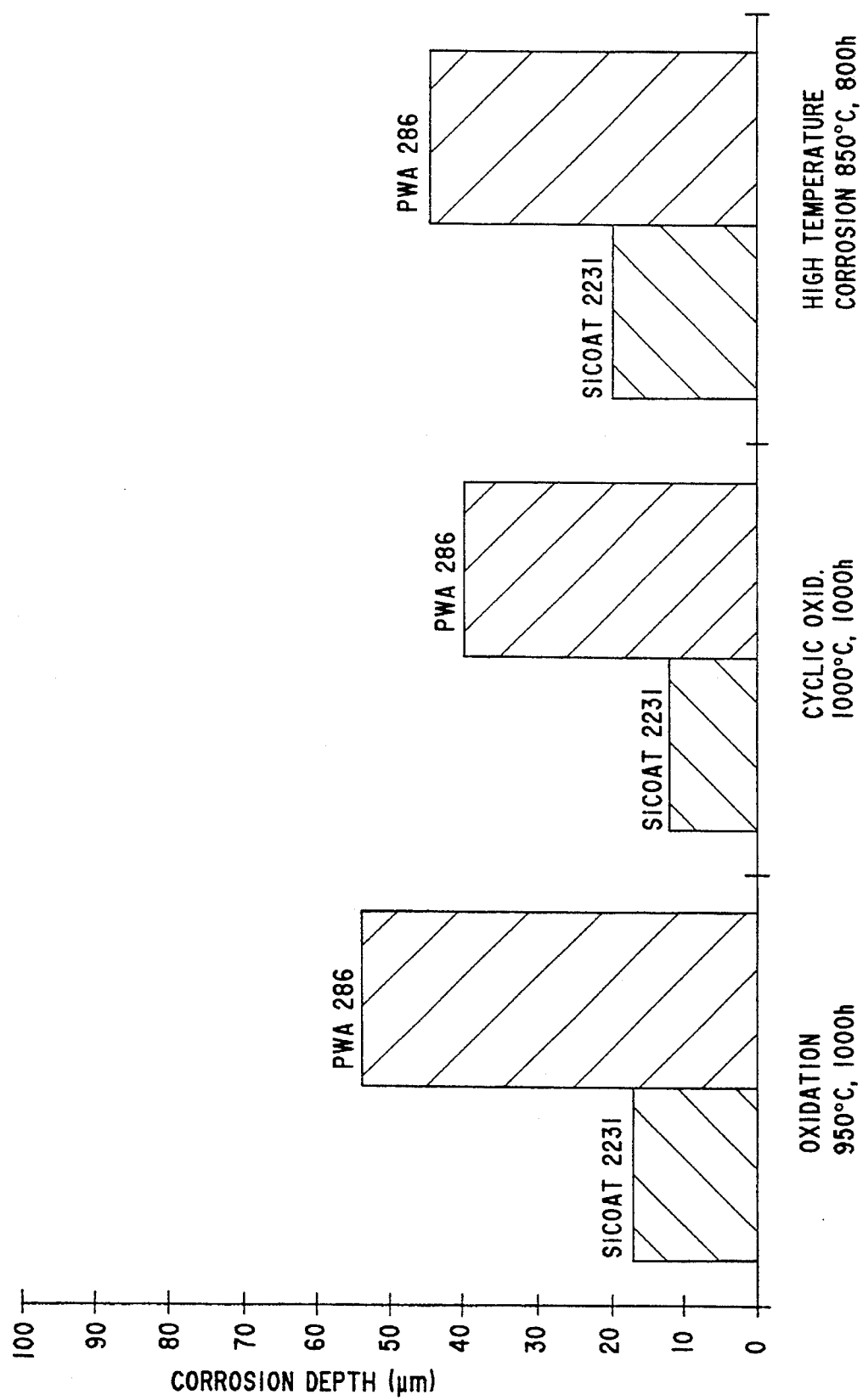
FIG. 2 is a bar graph showing comparative results of tests of a coating according to the invention and a prior art coating.

Referring now to FIG. 2, there are shown test results for a coating named SICOAT 2231 which is an inventive coating and a prior art coating named PWA 286 and developed by United Technologies Corporation.

The composition of SICOAT 2231 is as follows:

30% nickel, 28% chromium, 8% aluminum, 0.6% yttrium, 0.7% silicon, balance cobalt.

The composition of PWA 286 is as follows:

22% cobalt, 17% chromium, 12.5% aluminum, 0.6% yttrium, 0.4% silicon, 0.25% hafnium, balance nickel The tests performed were keying coated specimens in an oxidative environment at 950° C. for 1000 hours, cyclically heating the specimens to 1000° C. and cooling down in an oxidative environment for 1000 hours and subjecting the specimens to high-temperature corrosion in a burner rig apparatus at 850° C. for 800 hours. The parameter measured after each test was a depth of penetration of the respective attack into the tested coating, generally referred to a "corrosion depth".

The ordinate of FIG. 2 shows corrosion depths measured at the specimens after the tests. The superiority of the inventive coating is immediately apparent.

This superiority is rather unexpected, because the inventive coating contains considerably less aluminum than the prior art coating, the aluminum content being regarded as material for good oxidation resistance by those skilled in the art, as it is the aluminum which forms an oxide layer on the coating which is deemed to account for the oxidation resistance.

According to the invention, the activity of the aluminum in the coating is reinforced by the chromium content, which is substantially higher than in the prior art coating.

The setting of aluminum and chromium contents according to the invention has the further benefit of improving the ductility of the coating considerably by avoiding an excessively high aluminum content which must embrittle the coating increase the danger of spalling of the coating from the substrate.

Coatings according to this invention no longer make it necessary to compromise between corrosion resistance and ductility (important for tear resistance and adhesion). These properties are not only optimized relative to each other, but they are vastly improved over the prior art.

We claim:

1. A method of protecting a component made from nickel-based or cobalt-based superalloy from corrosion at elevated temperatures, which comprises applying to the component a protective coating consisting essentially of the following elements (in percent by weight):

25 to 40% nickel; 28 to 32% chromium; 7 to 9% aluminum; 0.5 to 2% silicon; 0.3 to 1% of at least one reactive element of the rare earths; selectively from 0 to 15% of at least one of the elements of the group consisting of rhenium, platinum, palladium, zirconium, manganese, tungsten, titanium, molybdenum, niobium, iron, hafnium, and tantalum, the total share of the elements of the group being from 0 to a maximum of 15%; impurities; and a remainder of at least 5% cobalt; and the component and the coating applied thereon having a ductile brittle transition temperature below 600° C.

2. The method according to claim 1, wherein the component is a nickel-based superalloy consisting essentially of the following elements (in percent by weight):

0.08 to 0.1% carbon, 12 to 16% chromium, 8 to 10% cobalt, 15 to 2% molybdenum, 2.5 to 4% tungsten, 1.5 to 4.5% tantalum, 0 to 1% titanium, 0 to 0.1% zirconium, 0 to 1% hafnium, and a balance of nickel.

3. The method according to claim 1, wherein the component is a nickel-based superalloy consisting essentially of the following elements (in percent by weight):

0.08 to 0.1% carbon; 12 to 16% chromium; 8 to 10% cobalt; 1.5 to 2% molybdenum; 2.5 to 4% tungsten; 1.5 to 4.5% tantalum; 0 to 1% titanium; 0 to 0.1% zirconiums 0 to 1% hafnium a trace amount of boron; and a balance of nickel.

4. The method according to claim 1, wherein the protective coating has a thickness of between 200 μm and 300 μm.

5. The method according to claim 1, wherein the component is a gas turbine component to be exposed to temperatures within a range from 600° C. to 1150° C.

6. The method according to claim 1, wherein the component is a nickel-based superalloy consisting essentially of the following elements (in percent by weight):

0.07 to 0.1% carbon; 12 to 16% chromium; 8 to 10% cobalt; 1.5 to 2% molybdenum; 2.5 to 4% tungsten; 1.5 to 5% tantalum; 0 to 1% niobium; 3 to 4% aluminum; 3.5 to 5% titanium; 0 to 0.1% zirconium; 0 to 1% hafnium; an optional trace amount of boron; and a balance of nickel.

7. A method of protecting a component made from nickel-based or cobalt-based superalloy from corrosion, which comprises applying a protective coating applied on the component the protective coating comprising in percent by weight:

25 to 40% nickel; 28 to 32% chromium; 7 to 9% aluminum; 0.5 to 2% silicon; 0.3 to 1% of at least one reactive element of the rare earths; an addition of from 1 to 15% rhenium; impurities and a remainder of at least 5% cobalt.

\* \* \* \* \*